United States Patent [19]

Moller et al.

[11] Patent Number: 5,170,492
[45] Date of Patent: Dec. 8, 1992

[54] DIGITALLY FREQUENCY-LOCKING A RADIO TRANSCEIVER TO THE RECEIVED SIGNAL

[75] Inventors: Paul J. Moller, Streamwood; Douglas W. Main, Palatine, both of Ill.; David K. Ford, Mesa, Ariz.

[73] Assignee: Motorola, Inc., Schaumburg, Ill.

[21] Appl. No.: 808,941

[22] Filed: Dec. 13, 1991

Related U.S. Application Data

[63] Continuation of Ser. No. 468,040, Jan. 22, 1990, abandoned.

[51] Int. Cl.$^5$ ............................ H04B 1/40; H04B 7/00
[52] U.S. Cl. ................................. 455/76; 455/182.2; 455/192.2; 455/260; 455/265; 331/17; 375/97
[58] Field of Search .................. 455/73, 75-76, 455/164, 182, 183, 184, 186, 192, 257, 259, 265, 260; 331/1 A, 17; 375/97

[56] References Cited

U.S. PATENT DOCUMENTS

| | | | |
|---|---|---|---|
| 4,438,528 | 3/1984 | Itagaki | 455/182 |
| 4,498,191 | 2/1985 | Rogers | 455/182 |
| 4,691,377 | 9/1987 | Yoshihara et al. | 455/259 |
| 4,696,056 | 9/1987 | Morita | 375/97 |
| 4,703,520 | 10/1987 | Rozanski et al. | 455/75 |
| 4,805,230 | 2/1989 | Tanaka | 455/182 |

FOREIGN PATENT DOCUMENTS 0182317 8/1986 Japan .................. 455/259

OTHER PUBLICATIONS

"Nordic Cellular Mobile Telephone" Motorola Instruction Manual No. 68P81076E20-0 Jun. 1, 1987.

*Primary Examiner*—Reinhard J. Eisenzopf
*Assistant Examiner*—Andrew Faile
*Attorney, Agent, or Firm*—Rolland R. Hackbart

[57] ABSTRACT

A unique cellular telephone (100) digitally frequency locks to the received base station transmitter signal. The cellular telephone (100) includes a radio transceiver (106), a reference oscillator (104), and microcomputer (102) with memory therein for controlling the operation thereof. The radio transceiver (106) includes a phase-locked loop (PLL) synthesizer 120, a receiver mixer (122) followed by one or more gain stages (124), a phase detector (126), and a divider (128). The PLL synthesizer (120) generates a signal locked to the reference oscillator (104) that is mixed with the incoming base station transmitter signal in the receive mixer (122) to generate an intermediate frequency signal. The output of the reference oscillator (104) also feeds the divider (128), which divides the reference oscillator signal by an amount so as to generate the divided signal having a frequency substantially the same as the frequency of the intermediate frequency signal from the mixer (122). The output of the divider (128) and the amplified intermediate frequency signal from the amplifier (124) are both fed into the phase detector (126), which generates a binary error signal (110). The microcomputer (102) is responsive to the binary error signal (110) for frequency locking reference oscillator 104 to the received base station transmitter signal.

4 Claims, 2 Drawing Sheets

025
DIGITALLY FREQUENCY-LOCKING A RADIO TRANSCEIVER TO THE RECEIVED SIGNAL

This is a continuation of application Ser. No. 07/468,040, filed Jan. 22, 1990 and now abandoned.

BACKGROUND OF THE INVENTION

The present invention is generally related to radio-telephones, and more particularly to digitally frequency-locking a cellular telephone to the received signal.

In some countries, cellular telephones are required to meet a maximum transmitter frequency error specification. In order to maintain the transmitter frequency within the maximum transmitter frequency error specifications, such cellular telephones currently use an analog frequency control circuit which compares the received signal frequency to the cellular telephone reference oscillator to develop an analog correction voltage. The analog correction voltage is applied to the cellular telephone reference oscillator to frequency lock it to the received signal frequency, which is very accurately maintained by the base station radio. However, such prior analog frequency control circuits necessitate digital-to-analog conversion circuitry and analog comparators thereby incurring substantial additional costs.

OBJECTS OF THE INVENTION

Accordingly, it is an object of the present invention to provide a unique method of digitally frequency-locking a transceiver to the frequency of the received signal.

It is another object of the present invention to provide a unique method of digitally frequency-locking a transceiver to the frequency of the received signal and correcting the initial turn on frequency of the transceiver each time the transceiver is frequency locked.

DETAILED DESCRIPTION OF THE PREFERRED EMBODIMENT

Figure 1:
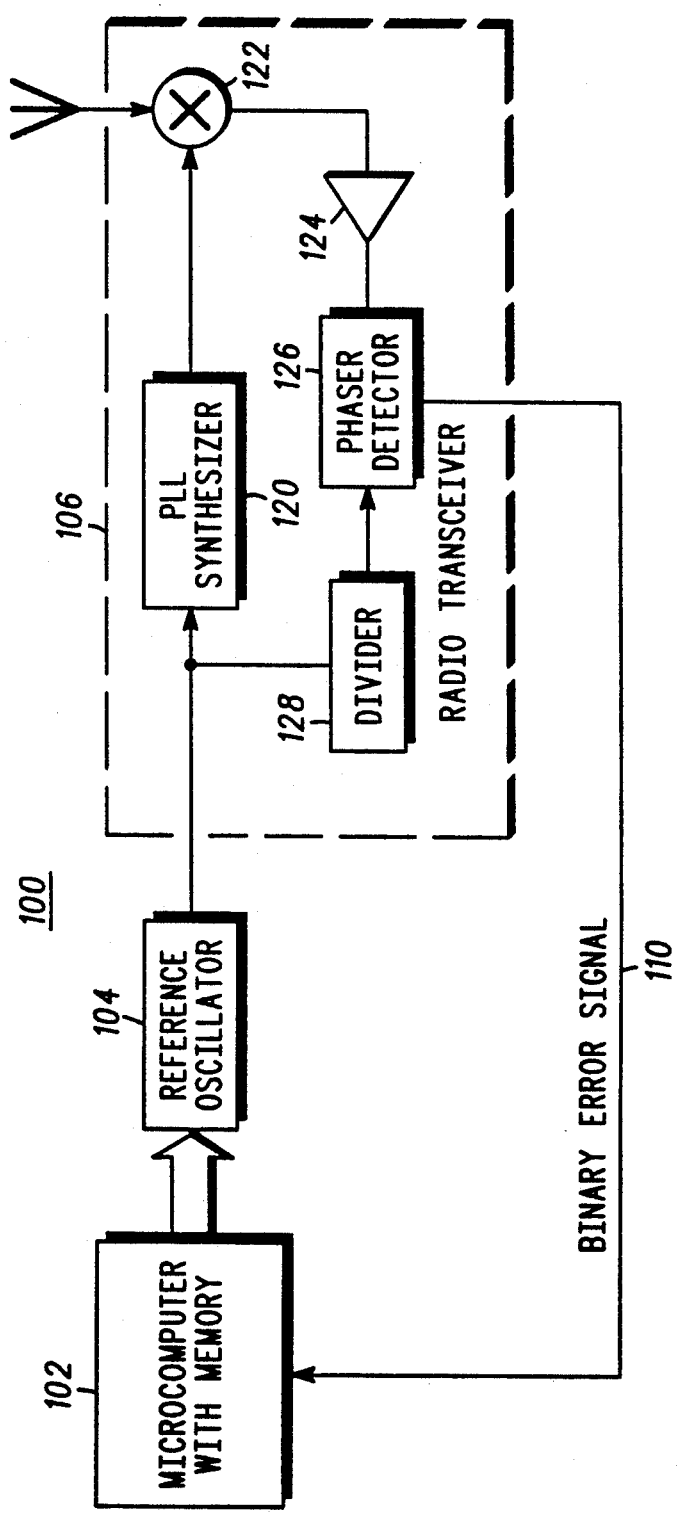
FIG. 1 is a block diagram of a cellular telephone 100 embodying the present invention.

Referring to FIG. 1, there is illustrated a block diagram of a cellular telephone 100 embodying the present invention. Cellular telephone 100 includes a radio transceiver 106, a reference oscillator 104, and microcomputer 102 with memory therein for controlling the operation thereof. Only the portion of transceiver 106 that generates the binary error signal 110 has been illustrated. According to the present invention, microcomputer 102 is responsive to the binary error signal 110 for frequency locking reference oscillator 104 to the radio signal received by radio transceiver 106. Radio transceiver 106 also includes a radio receiver and transmitter (not shown), which may be a Nordic-type 900 MHz cellular telephone transmitter and radio receiver, such as, for example, the transceiver shown and described in Motorola instruction manual number 86P09300A10, entitled "MICROTAC. Cellular Personal Telephone," published by and available from Motorola C & E Parts, 1313 East Algonquin Road, Schaumburg, Ill. 60196.

In the Nordic telephone system currently in use in Norway, Sweden, Denmark and Finland, the transmitter frequency of cellular telephone 100 must be within 900 Hertz of the specified transmitter frequency for each radio channel (for example, channels with TX/RX frequencies extending from 890.0125/935.0125 MHz to 914.9875/959.9875 MHz for the Nordic Mobile Telephone described in Motorola Instruction Manual No. 68P81076E20). Since the base station transmitter frequency is maintained within 250 Hertz of its specified transmitter frequency, cellular telephone 100 may be frequency locked to the received base station transmitter signal in order to meet the Nordic specifications. Since the frequency of reference oscillator 104 changes with time, it is also important to compensate for the frequency aging of reference oscillator 104 in order to meet the Nordic specifications, which further require that the frequency error of the cellular telephone transmitter be within specified limits within two seconds of acquisition of the base station transmitter signal over its entire operating life. By utilizing the present invention, microcomputer 102 is responsive to the binary error signal 110 for rapidly frequency locking reference oscillator 104 to the base station transmitter signal received by radio transceiver 106, such that the reference oscillator frequency is maintained within the Nordic specifications during the entire operating life of cellular telephone 100.

Referring to FIG. 1, radio transceiver 106 includes a phase-locked loop (PLL) synthesizer 120, a receiver mixer 122 followed by one or more gain stages 124, a phase detector 126, and a reference oscillator divider 128. The PLL synthesizer 120 generates a signal locked to reference oscillator 104 (for example, a 14.4 MHz reference oscillator is used in the Nordic Mobile Telephone described in Motorola Instruction Manual No. 68P81076E20) that is mixed with the incoming base station transmitter signal in receive mixer 122 to generate an intermediate frequency signal that is then amplified by amplifier 124. The output of reference oscillator 104 also feeds a divider 128, which divdes the reference oscillator signal by an amount so as to generate the divided signal having a frequency substantially the same as the frequency of the intermediate frequency signal from mixer 122. The output of divider 128 and the amplified intermediate frequency signal from amplifier 124 are both fed into the phase detector 126, which generates a binary error signal (BES) 110 which is either binary HI or binary LO depending on the frequency difference between reference oscillator 104 and the received base station transmitter signal. BES 110 is binary HI if the frequency of reference oscillator 104 is less than the frequency of the received base station transmitter signal. BES 110 is binary LO if the frequency of reference oscillator 104 is greater than the frequency of the received base station transmitter signal. Although theoretically the frequency of reference oscillator 104 and the frequency of the received base station transmitter signal may be identical, such will never occur in practice during operation of cellular telephone 100. Therefore, BES 110 may be chosen to be either binary HI or binary LO if the frequency of reference oscillator 104 and the frequency of the received base station transmitter signal are identical. BES 110 is then fed into microcomputer 102 as an input signal RES for decision making. Microcomputer 102 is connected to and has control of the frequency of reference oscillator 104 via a communication bus therebetween. During operation of cellular telephone 100, microcomputer 102 loads the current frequency into reference oscillator 104 whenever it is changed.

Figure 2:
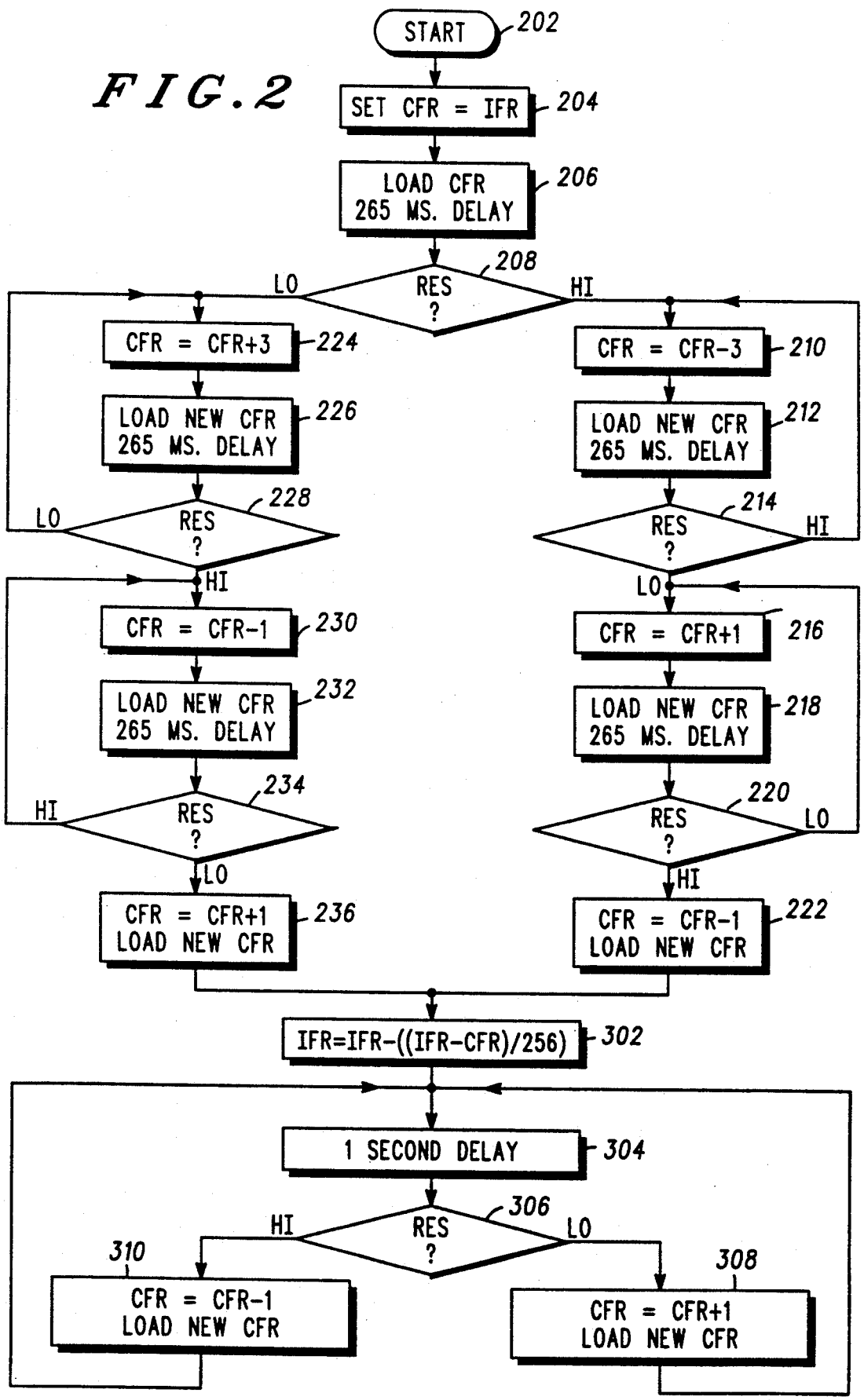
FIG. 2 is a flow chart for the process used by microcomputer 102 in FIG. 1 for substantially frequency locking the reference oscillator 104 to the received signal.

Referring next to FIG. 2, there is illustrated a flow chart for the process used by microcomputer 102 in FIG. 1 for substantially frequency locking the reference oscillator 104 to the received base station transmitter signal. Entering at START block 202, the process proceeds to block 204, where the current frequency register (CFR) is set equal to the initial frequency register (IFR). Next a 265 ms. delay at block 206 is executed and CFR is loaded into reference oscillator 104. Then, at decision block 208, the binary error signal (RES) 110 is tested for binary HI or LO. If RES is determined to be binary HI, then a sequence beginning with block 210 is executed where three is subtracted from CFR. A decrement of three is selected to produce a relatively large change in the frequency of reference oscillator during initial acquisition of the base station transmitter signal. Next a 265 ms. delay at block 212 is executed and the new CFR is loaded into reference oscillator 104.

Then RES is tested for binary HI or LO in decision block 214. If RES is found to be binary HI, then execution returns to block 210 for continued execution. However, if RES is found to binary LO, then execution proceeds to block 216 where one is added to CFR. At this point, the frequency of reference oscillator 104 has been adjusted in three unit increments (each corresponding to a three unit increment of CFR) beyond the desired frequency of the received base station transmitter signal, as indicated by the change in binary state of RES from binary HI to LO. Hereafter, a decrement of one is selected to produce a relatively small change in the frequency of reference oscillator during final acquisition of the base station transmitter signal. Next a 265 ms. delay at block 218 is executed and the new CFR is loaded into reference oscillator 104.

Next, in decision block 220, RES is tested for binary HI or LO. If RES is found to be binary LO, execution returns to block 216 for continued execution. However, if RES is found to be binary HI, execution proceeds to block 222 where one is subtracted from CFR. At this point, the frequency of reference oscillator 104 has been adjusted in one unit increments (each corresponding to a one unit increment of CFR) beyond the desired frequency of the received base station transmitter signal, as indicated by the change in binary state of RES from binary LO to HI. Hereafter, execution will proceed to block 302.

Returning to decision block 208, if RES was found to be binary LO, execution proceeds with a sequence beginning with block 224 where three is added to CFR. As explained above, steps of three are taken in order to produce a relatively large change in the frequency of reference oscillator 104 during initial acquisition of the base station transmitter signal. Next a 265 ms. delay at block 226 is executed and the new CFR is loaded into reference oscillator 104. Then RES is tested for binary HI or LO in decision block 228. If RES is found to be binary LO, execution returns to block 224 for continued execution. If RES is found to be binary HI then execution continues to block 230 where one is subtracted from CFR. As explained above, steps of one are taken in order to produce a relatively small change in the frequency of reference oscillator 104 during final acquisition of the base station transmitter signal. Then a 265 ms. delay at block 232 is executed and the new CFR is loaded into reference oscillator 104. Next, RES is tested for binary HI or LO in decision block 234. If RES is found to be binary HI, execution returns to block 230 for continued execution. If RES is found to be binary LO, execution continues to block 236 where one is added to CFR. At this point, execution will proceed to block 302.

Next, execution continues from blocks 236 and 222 to block 302 where IFR is set equal to the value of IFR-(IFR-CFR)/256. At this point, frequency lock has been obtained, and, according to a feature of the present invention, IFR is updated to account for aging that occurred since the last update. Thus, according to the present invention, each time cellular telephone 100 is powered up or each time the base base station transmitter signal is acquired or re-acquired, the initial frequency for reference oscillator 104 is updated and stored for subsequent use. The difference between IFR and CFR is divided by 256 so that IFR is updated by a small amount each time the process of FIG. 2 is executed. In other embodiments of cellular telephone 100, the incremental update to IFR may be varied by selecting a different divisor.

Next, execution continues to block 304 where a one second delay is executed and the new CFR is loaded into reference oscillator 104. Once frequency lock has been obtained, the frequency of reference oscillator 104 is changed at one second intervals instead of 265 ms. intervals. In other words, the rate of change of the frequency of reference oscillator 104 is decreased once frequency lock is reached. Then, in decision block 306, RES is tested for binary HI or LO. If RES is found to be binary LO, then execution continues to block 308 where one is added to CFR and the new CFR is loaded into reference oscillator 104. Next, execution returns to block 304 for continued execution. However, if in decision block 306, RES is found to be binary HI, execution would proceed to block 310 where one is subtracted from CFR and the new CFR is loaded into reference oscillator 104. Next, execution would return to block 304 for continued execution until cellular telephone 100 is powered up again or the base station transmitter signal is re-acquired, at which time execution returns to block 202 in FIG. 2 to repeat the foregoing process.

In summary, a unique cellular telephone has been described which digitally frequency-locks the transceiver thereof to the frequency of the received signal and corrects the initial turn on frequency of the transceiver each time the transceiver is frequency locked.

We claim:

1. A method for substantially frequency locking a reference oscillator signal of a reference oscillator of a radio transceiver having a microcomputer with a register, to the radio signal received by the radio transceiver, the register storing an initial frequency, said method comprising the steps of:

setting the frequency of the reference oscillator to the stored initial frequency in the register;

dividing the reference oscillator signal to produce a divided reference oscillator signal;

generating a synthesizer signal locked to the reference oscillator signal;

mixing the synthesizer signal and the received radio signal to produce an intermediate frequency signal;

comparing the frequency of the divided reference oscillator signal to the frequency of the intermediate frequency signal and producing an error signal having a binary one state if the frequency of the divided reference oscillator signal is less than or equal to the frequency of the intermediate frequency signal, and a binary zero state if the frequency of the divided reference oscillator signal is greater than the frequency of the intermediate frequency signal;

sampling the binary state of the error signal at successive time intervals each having a first predetermined length of time and increasing the frequency of the reference oscillator by a first predetermined amount if the error signal has a binary one state and decreasing the frequency of the reference oscillator by the first predetermined amount if the error signal has a binary zero state, until the binary state of the error signal changes;

when the binary state of the error signal changes a first time, thereafter sampling the binary state of the error signal at successive time intervals each having a second predetermined length of time and increasing the frequency of the reference oscillator by a second predetermined amount if the error signal has a binary one state and decreasing the frequency of the reference oscillator by the second predetermined amount if the error signal has a binary zero state, said second predetermined amount being less than said first predetermined amount; and when the binary state of the error signal changes a second time, adjusting the stored initial frequency an amount related to the difference between the frequency of the reference oscillator and the stored initial frequency and storing the adjusted initial frequency in the register.

2. The method according to claim 1, further including the step of repeating the preceding steps each time power is applied to the radio transceiver.

3. The method according to claim 1, further including the step of repeating the preceding steps each time the radio signal is first received by the radio transceiver.

4. The method according to claim 1, further including the step of sampling the binary state of the error signal at successive time intervals each having a third predetermined length of time and increasing the frequency of the reference oscillator by the second predetermined amount if the error signal has a binary one state and decreasing the frequency of the reference oscillator by the second predetermined amount if the error signal has a binary zero state, the third predetermined length of time being greater than the second predetermined length of time.

* * * * *